United States Patent [19]

Taguchi

[11] Patent Number: 4,803,308
[45] Date of Patent: Feb. 7, 1989

[54] PRINTED CIRCUIT BOARD
[75] Inventor: Toshimichi Taguchi, Osaka, Japan
[73] Assignee: Sharp Kabushiki Kaisha, Osaka, Japan
[21] Appl. No.: 201,337
[22] Filed: May 27, 1988

Related U.S. Application Data

[63] Continuation of Ser. No. 17,153, Feb. 20, 1987, abandoned.

[30] Foreign Application Priority Data

Feb. 21, 1986 [JP] Japan .............................. 61-24915[U]

[51] Int. Cl.⁴ ............................................... H05K 1/00
[52] U.S. Cl. .................................. 174/68.5; 228/180.1
[58] Field of Search ...................... 174/68.5; 228/180.1

[56] References Cited

U.S. PATENT DOCUMENTS 3,470,612 10/1969 Helms ................................. 174/68.5
3,496,419  2/1970 Sakellakis ........................... 174/68.5
3,912,852 10/1975 Simon ................................. 174/68.5
3,939,381  2/1976 Meany ............................ 174/68.5 X
4,613,924  9/1986 Brault ................................. 174/68.5

OTHER PUBLICATIONS

Renz, U; Test Probe Contact Grid Translator Board; IBM Technical Disclosure Bulletin; vol. 21, No. 8, Jan. 1979; pp. 3235–3236.
Wager, A. J. et al; Printing a Wiring Pattern; IBM Technical Disclosure Bulletin; vol. 11, No. 7, Dec. 1968; p. 709.

Primary Examiner—Morris H. Nimmo
Attorney, Agent, or Firm—Flehr, Hohbach, Test, Albritton & Herbert

[57] ABSTRACT

A printed circuit board has a copper foil pattern formed thereon in the shape of exclamation marks oriented in the direction of solder flow such that undesirable peelback effects can be isolated and the amount of solder attached to the pattern can be uniformly controlled.

13 Claims, 4 Drawing Sheets 4,803,308

PRINTED CIRCUIT BOARD

This is a continuation of application Ser. No. 017,153, filed Feb. 20, 1987, now abandoned.

BACKGROUND OF THE INVENTION

This invention relates to a printed circuit board and more particularly to the shape of copper foil pattern formed thereon. Printed circuit boards are generally manufactured by inserting various components from one side of a board and then mounting parts such as display tubes and flat LSI circuits on the other side. Many methods of automating this process have been considered such as the use of a soldering iron, soldering with heated air, laser beam soldering and soldering by exposure to a lamp. For a high-quality soldering work, however, it is critically important to be able to supply solder at an optimum rate. For this reason, attempts have been made to apply creamy solder to specified soldering positions preliminarily by using a dispenser, by screen printing and by stamping. With any of these methods, however, it is difficult to apply the creamy solder uniformly because it frequently happens that the viscosity of solder changes during the process, foams are developed inside the dispenser, nozzles become clogged or the amount attached to the stamp fluctuates. For the purpose of applying the solder uniformly, furthermore, care must be taken to ascertain before creamy solder is applied to the board that there is no residual solder present at the positions of interest because the amount of such residual solder is totally unpredictable. For this reason, extra processes become necessary such as preliminarily applying a masking agent to prevent solder from attaching and peeling it off after dip soldering is finished. Moreover, the flux contained in creamy solder is extremely active with high basicity and copper foil patterns and mounted components must be protected from its corrosive effects by washing but washing is done manually in almost all cases. In summary, methods of using creamy solder are expensive to operate because there are at least four additional processes to be included, that is, application and removal of masking agent, application of creamy solder and washing. In addition, use of expensive creamy solder, masking material and washing agent adds to the cost of the operation.

In view of the above drawbacks, methods of making effective use of the solder which becomes attached by the dip soldering process have been considered, but since the amount of solder which becomes attached is completely unpredictable, a so-called hot air knife method may be utilized whereby excess solder is blown off by a hot wind of about 273° C. or above immediately after the dip soldering. By this method, however, too much solder is sometimes blown away and holes are left behind.

According to still another method, a router is used after the solder hardens to scrape it off mechanically. The amount of solder thus scrapped is not always constant, however, because of thermal distortion due to the heat of soldering and this happens in particular in the case of a single-side circuit board. In addition, there remains the problem of the scraped solder pieces scattering all over and this method is also expensive to operate.

SUMMARY OF THE INVENTION

It is therefore an object of the present invention to provide a printed circuit board with an improved copper foil pattern such that the amount of solder attached thereon by dip soldering can be made reliably uniform.

The above and other objects of the present invention are achieved by providing a printed circuit board with a copper foil pattern in the shape of exclamation marks in the direction of the solder flow.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION OF THE INVENTION

Figure 1:
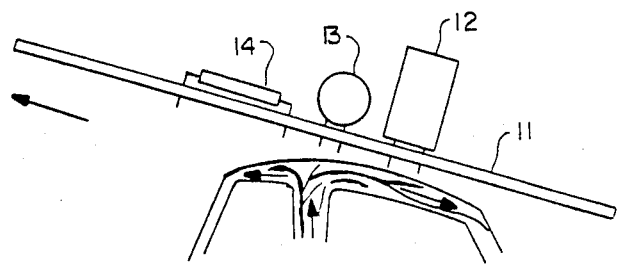
FIG. 1 is a schematic drawing showing the first step in the fabrication of a printed circuit board by applying solder to one side thereof.
Figure 2:
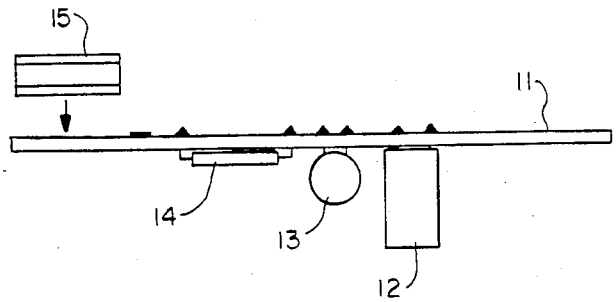
FIG. 2 is a schematic drawing showing the second step in the fabrication of a printed circuit board with the board placed in upside-down position.
Figure 5A:
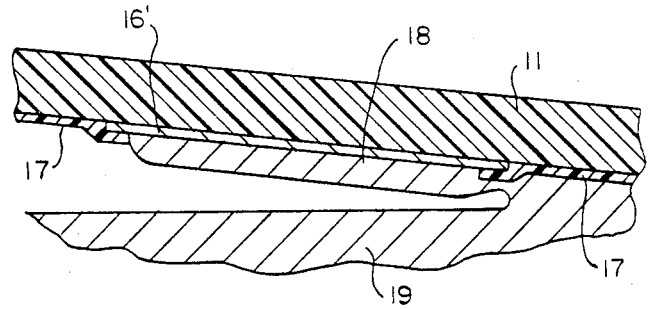
FIGS. 5A–5C are schematic drawings showing the phenomenon of peelback during the fabrication of a printed circuit board with a prior art copper foil pattern.
Figure 5B:
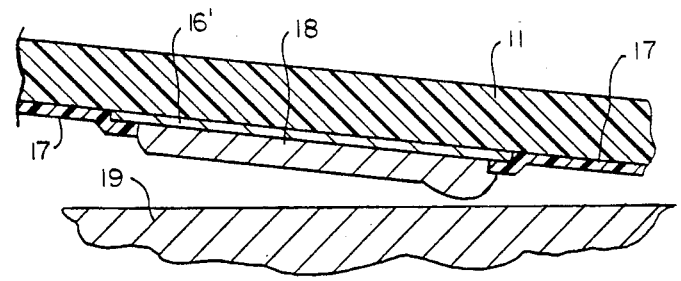
Figure 5C:
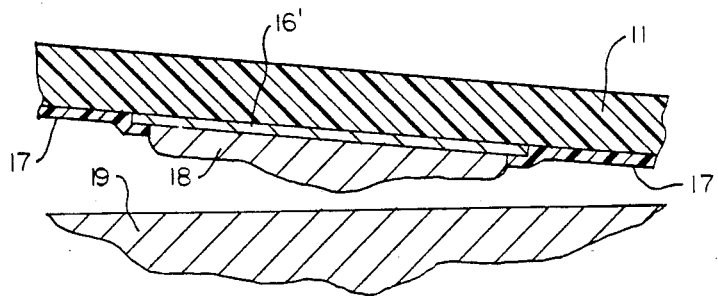
Figure 3:
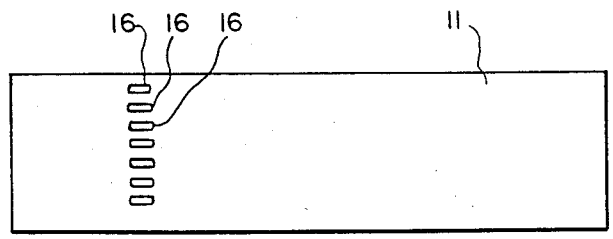
FIG. 3 is a plan view of a printed circuit board being fabricated, schematically showing an arrangement of copper foil pattern.
Figure 4:
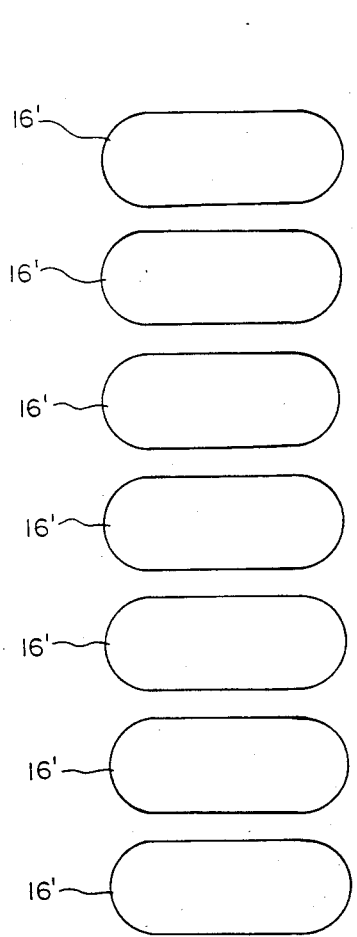
FIG. 4 is a copper foil pattern on a prior art printed circuit board being fabricated.

A printed circuit board is typically manufactured as shown schematically in FIG. 1 by inserting various parts 12, 13 and 14 into a substrate 11 from one side and then applying a solder on the other side. Thereafter, the substrate 11 is flipped upside-down as shown in FIG. 2 and the solder which became attached is used to mount a component 15. If such a component to be attached on the back side has a large number of lead terminals, a resist or copper foil pattern is generally formed as schematically shown in FIG. 3 wherein the pattern of spots to which leads may be attached later is described only symbolically without representing their exact shapes and indicated by numerals 16 with respect to the substrate 11. These spots may be pieces of a metal foil or alternatively formed by openings created in a resist layer covering a copper foil (as shown below in FIGS. 5A–5C and 7A–7D). If the pattern 16 of FIG. 3 is actually shaped as shown by numerals 16' in FIG. 4, however, bridge-like formations or particularly thick piles frequently result at the center sections of the spots. This comes about as shown in FIGS. 5A–5C wherein numeral 17 indicates a layer of solder resist covering a copper foil 16' on the substrate 11 with openings forming a pattern as shown in FIG. 4. The solder resist, as is well known, may be an epoxy resin and serves to prevent the solder from becoming attached anywhere other than intended areas such as copper foil parts. When the solder 18 attached to the copper foil patterns 16' becomes separated from the rest 19 (or at the time of "peelback"), the extra amount of solder left on the pattern 16' as shown in FIG. 5B is pulled by its surface tension towards the center of the pattern 16' as shown in FIG. 5C. Since the solder flow is always irregular, however, there is no way to predict where this phenomenon will take place.

Figure 6:
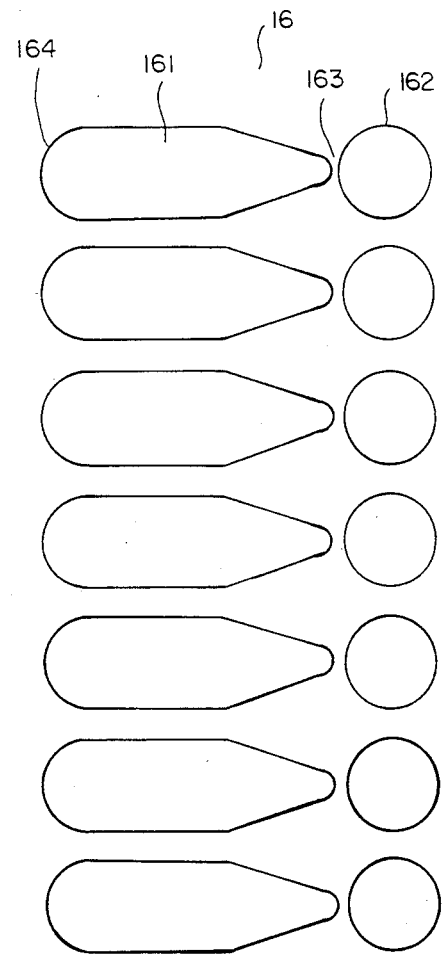
FIG. 6 is a copper foil pattern according to the present invention.

FIG. 6 is an enlarged plan view of the copper foil pattern 16 of FIG. 3 (formed by openings in the resist layer covering the copper foil as shown in FIGS. 7A-7D and explained below) according to one embodiment of the present invention characterized as being shaped like a row of exclamation marks oriented in the direction of the solder flow, each exclamation mark having an elongated part 161 and a circular solder pool 162 separated by a gap 163 and the elongated part 161 having a rounded forward end section 164. Each pattern of an exclamation mark may be formed, for the purpose of this invention, either by providing separate copper foil pieces in the shapes of the elongated part 161 and the circular solder pool 162 or by covering a single piece of copper foil with layer of solder resist but by leaving openings to underlying copper foil in the shape of an exclamation mark. The advantages gained by shaping the copper foil pattern 16 as above are explained next by way of FIGS. 7A-7D which show the peelback with the pattern shaped as shown in FIG. 6.

Figure 7A:
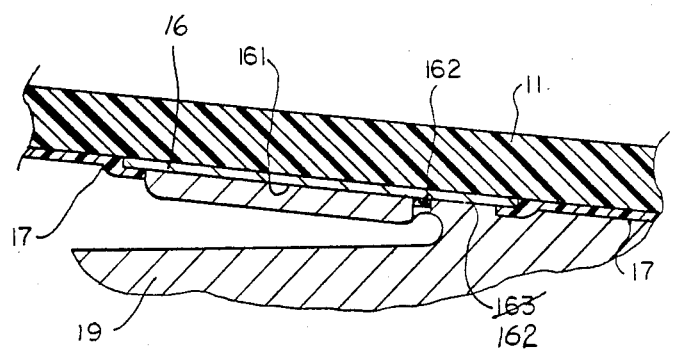
FIGS. 7A–7D are schematic drawings showing the phenomenon of peelback during the fabrication of a printed circuit board with copper foil pattern shown in FIG. 6, and FIGS. 8–13 are other copper foil patterns embodying the present invention.
Figure 7B:
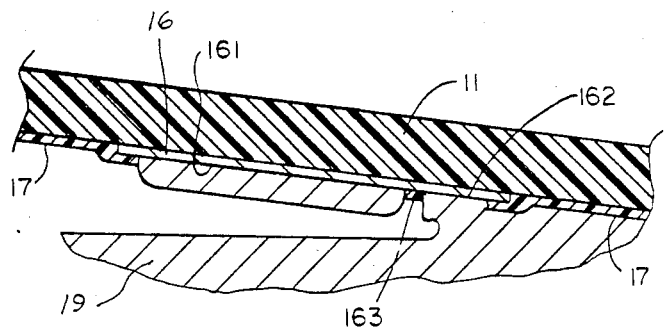
Figure 7C:
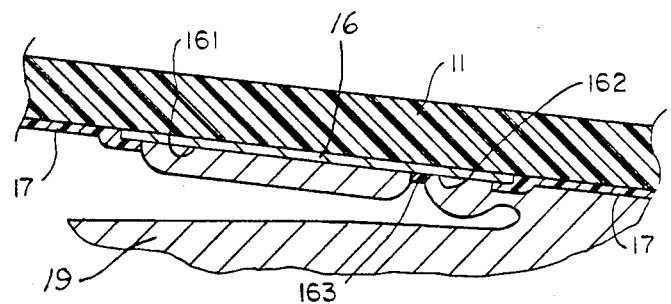
Figure 7D:
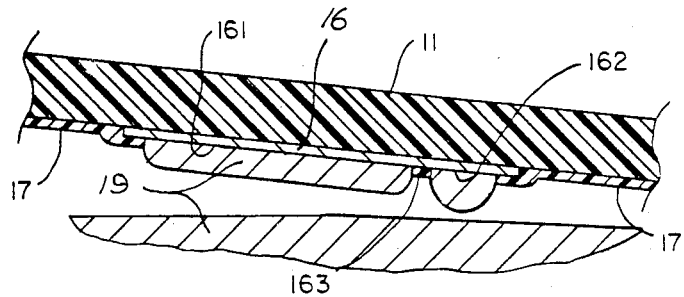
Figure 8:
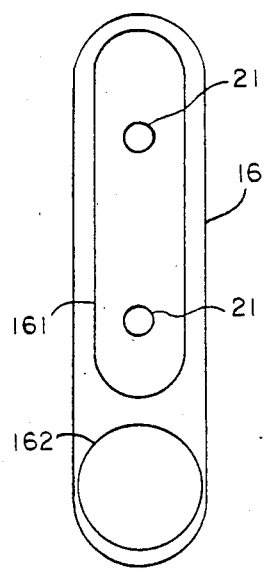
Figure 9:
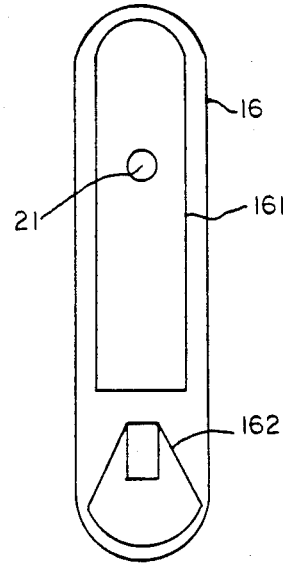
Figure 10:
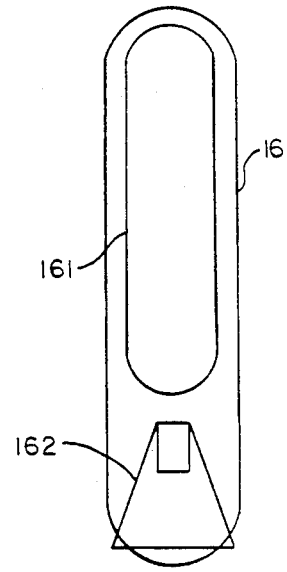
Figure 11:
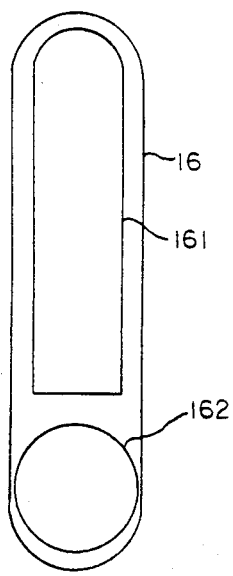
Figure 12:
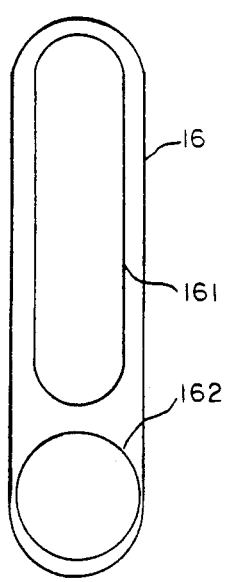

At the beginning of a peelback time (FIG. 7A), the solder surface looks somewhat as shown in FIG. 5A. When the part of the solder attached to the elongated portion 161 of the pattern 16 is separated, the part of the solder pool 162 is still connected because of the gap 163 as shown in FIG. 7B. The gap 163 essentially prevents the solder at the solder pool 162 from flowing back into the elongated portion 161 by surface tension. As a result, a thick layer of solder is formed at the circular solder pool 162 as shown in FIGS. 7C and 7D but the layer of solder at the elongated portion 161 remains flat, without bridge-like formation or a thick pile. The elongated portion 161 is made thinner towards the gap 163 while the solder pool 162 is made circular such that the surface tension of the solder will be smaller at the front than at the back of the gap 163. This serves to pull the solder backwards across the gap 163 when the solder separates (from FIG. 7C to FIG. 7D). In summary, the undesirable effects of peelback are moved to the solder pool 162 according to the present invention such that a solder layer of uniform thickness is obtained at the elongated part 161 of the pattern 16 which is separated by the gap 163 from the solder pool 162.

Figure 13:
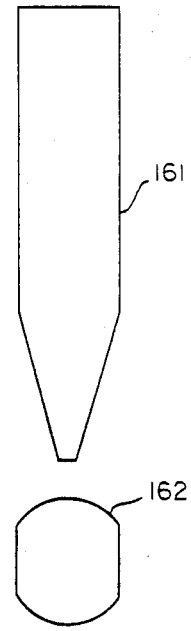

The foregoing description of a preferred embodiment of the invention has been presented for purposes of illustration and description. It is not intended to be exhaustive or to limit the invention to the precise form disclosed, and many modifications and variations are possible in light of the above teaching. The copper foil pattern 16 (or the pattern of openings formed in the resist layer which covers a copper foil) with an elongated port 161 and a solder pool 162 may be shaped alernatively as shown in FIGS. 6-13 wherein numeral 21 indicates solder resist for adjusting the amount of extra solder to be used for attaching flat LSI circuits and display device. In FIG. 13, numeral 22 indicates an adjacent pattern to show the separation between two mutually adjacent patterns.

Non-uniformity in the amount of solder has been a serious problem in automatic process for attaching components to the back surface of a printed circuit board but this problem is solved by properly shaping the copper foil pattern and solder resist on the circuit board according to the present invention.

What is claimed is:

1. In a printed circuit board including a substrate having a surface and copper foil pieces attached on said surface with some areas of said pieces being covered and other areas exposed, said exposed areas of said copper foil pieces describing a pattern, the improvement wherein said pattern includes a first part and a second part, said first part being elongated along and defining a line and said second part being separated from said first part being shorter than said first part and located on said line.

2. The printed circuit board of claim 1 wherein said separated second part is circular.

3. The printed circuit board of claim 1 wherein said elongated first part is thinner towards said separated second part.

4. The printed circuit board of claim 1 wherein said elongated first part includes one or more solder resist patches on said copper foil pieces to control the amount of solder attached to said pattern.

5. The printed circuit board of claim 1 further comprising a solder resist layer which is coveringly attached to said copper foil pieces and said surface of said substrate, said resist layer being provided with openings according to said pattern to expose portions of said copper foil pieces.

6. The printed circuit board of claim 1 wherein said line is substantially parallel to a solder flow direction defined on said surface.

7. The printed circuit board of claim 6 wherein said second part is near said first part and located downstream therefrom along said solder flow direction.

8. In a printed circuit board including a substrate having a surface and copper foil pieces attached on said surface, the improvement wherein said copper foil pieces form a pattern on said surface and wherein said pattern includes an elongated first part along and defining a line and a shorter second part near and separated from said elongated first part and located on said defined line.

9. The printed circuit board of claim 8 wherein said line is substantially parallel to a solder flow direction defined on said surface.

10. The printed circuit board of claim 9 wherein said second part is located downstream from said first part along said solder flow direction.

11. The printed circuit board of claim 8 wherein said separated second part is circular.

12. The printed circuit board of claim 8 wherein said elongated first part is thinner towards said separated second part.

13. The printed circuit board of claim 8 wherein said elongated first part includes one or more solder resist patches on said copper foil to control the amount of solder attached to said pattern.

* * * * *